United States Patent [19]

Wolfson

[11] Patent Number: 4,721,543
[45] Date of Patent: Jan. 26, 1988

[54] HERMETIC SEALING DEVICE

[75] Inventor: Sumner H. Wolfson, Tucson, Ariz.

[73] Assignee: Burr-Brown Corporation, Tucson, Ariz.

[21] Appl. No.: 792,164

[22] Filed: Oct. 24, 1985

Related U.S. Application Data

[63] Continuation of Ser. No. 428,593, Sep. 30, 1982, abandoned.

[51] Int. Cl.[4] .................... B29C 65/30; B29C 65/34
[52] U.S. Cl. .................... 156/380.2; 174/52 PE; 174/125; 156/273.9; 156/274.8; 156/275.3
[58] Field of Search ............... 156/358, 379.6–379.8, 156/380.2–380.4, 182, 272.2, 273.7, 273.9, 274.4, 274.8, 275.1, 275.3, 275.5, 275.7, 293, 499; 174/52 PE, 525, 52 H; 29/588; 357/72; 264/271.11–271.13; 269/310

[56] References Cited

U.S. PATENT DOCUMENTS

| | | | |
|---|---|---|---|
| 2,388,242 | 11/1945 | Arndt | 156/273.9 |
| 3,404,213 | 10/1968 | Brookover et al. | 29/588 |
| 3,768,157 | 10/1973 | Buie | 29/588 |
| 3,818,279 | 6/1974 | Seeger, Jr. et al. | 357/72 |
| 4,028,722 | 6/1977 | Helda | 174/52 PE |
| 4,110,506 | 8/1978 | Cottingham et al. | 156/379.7 |
| 4,126,758 | 11/1978 | Krumme | 29/588 |
| 4,249,034 | 2/1981 | Fichot | 352/72 |
| 4,291,815 | 9/1981 | Gordon et al. | 29/588 |
| 4,298,769 | 11/1981 | Richman | 29/588 |
| 4,571,921 | 2/1986 | Wolfson | 156/69 |

Primary Examiner—Donald E. Czaja
Assistant Examiner—Merrell C. Cashion, Jr.
Attorney, Agent, or Firm—Harry M. Weiss & Associates

[57] ABSTRACT

A method and apparatus for effecting a hermetic seal between an electronic component package and a package cover is disclosed. The method includes the steps of bonding a heater layer of conductive material to a sealing area of the package. A sealing material is then applied over a sealing area of the package cover. Optionally, a layer of sealing material may be applied over the conductive heater layer. The package and cover are contacted together and an electric current induced to flow within the conductive heater layer. The sealing material reacts to the heat caused by the electric current flowing in the heater layer, and bonds to the heater layer to effect a hermetic seal. Additionally, the seal can be intentionally broken by a reheating process to allow for repair or replacement of the electronic components contained within the package, and then resealed by the above described method.

1 Claim, 14 Drawing Figures

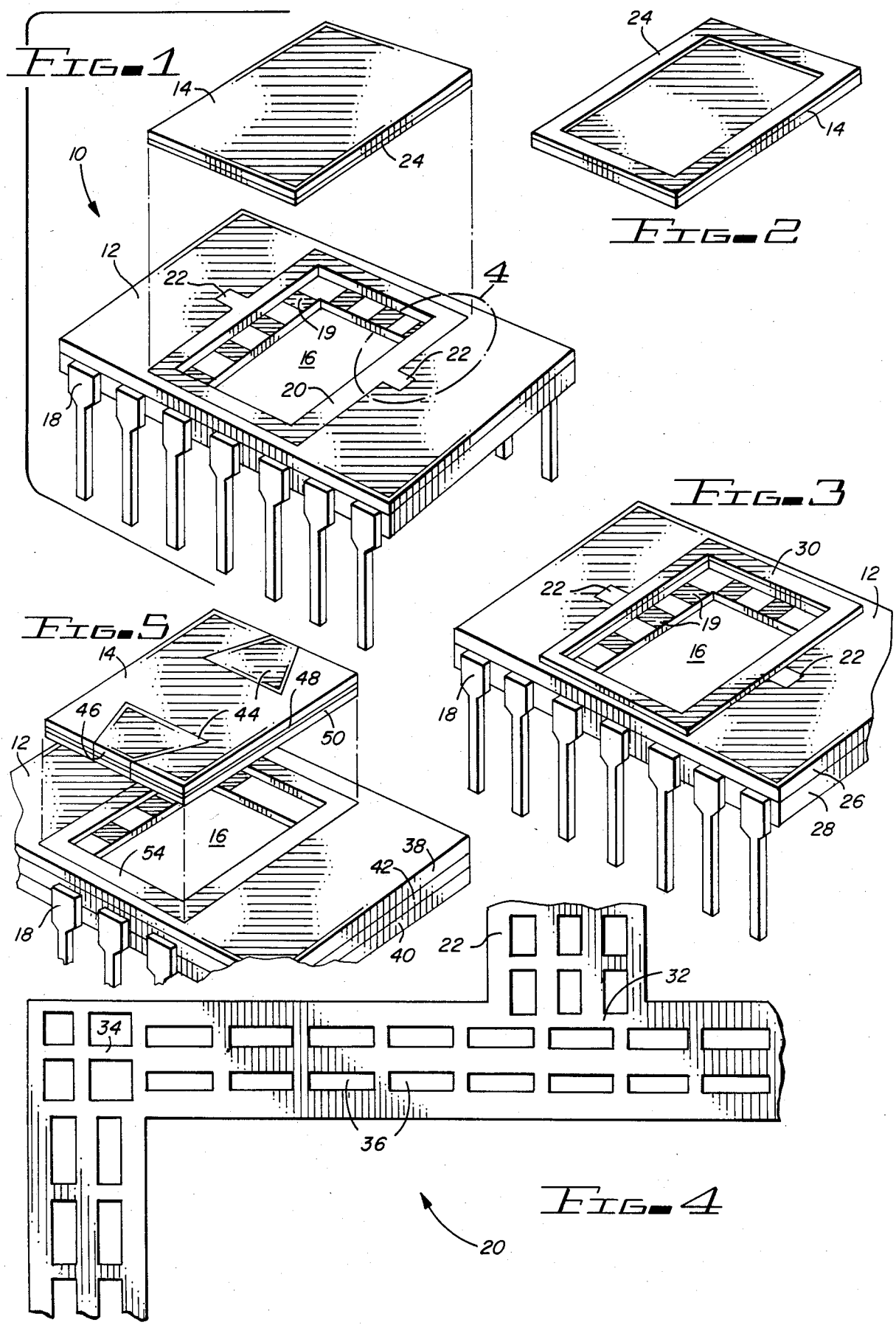

HERMETIC SEALING DEVICE

This application is a continuation of application 428,593, filed 9-30-1982, now abandoned.

CROSS REFERENCE TO RELATED APPLICATION

This application is related to a co-pending application entitled "Expendable Heater Sealing Process", filed on 9/2/81 and having Ser. No. 298,786, now U.S. Pat. No. 4,507,907. The above identified co-pending application is herein incorporated by reference.

BACKGROUND OF THE INVENTION

1. Field of the Invention

This invention relates generally to a sealing process and an apparatus therefor and, more particularly, to an improved method and apparatus, for effecting a hermetic seal between an electronic component package and a package cover.

2. Description of the Prior Art

Many electronic circuits and components are housed in sealed packages to protect them from possible damage due to exposure to the surrounding environment. Sealants employed in the past include (1) metallic sealants such as solders; (2) ceramics or various glasses; and (3) organic sealants such as epoxies. Of these, only the first two result in a truly hermetic seal since the organic sealants become permeable to large quantities of matter in a relatively short period of time (e.g. days) when compared to the life of the circuit housed within the package. If the sealant became permeable to, for example, water vapor, a chemical reaction could take place with certain ions within the package such as chlorine, sodium and potassium to produce corrosive products which would in turn attach wiring and/or the electronic components, and hasten failure of the packaged circuit.

Several metal alloys have been employed as sealants with varying results. One very desirable property of a metallic sealant is its ability to withstand high temperatures. For example, ordinary lead-tin solder provides satisfactory seals at temperatures up to 125° C. For higher temperatures, such as 150° C., an alloy of 80 percent gold and 20 percent tin is preferable, although it is obviously expensive. Unfortunately, the melting point of this alloy is approximately 280° C., and fusing the material during the sealing process may heat the housed electronic components, possibly resulting in undesirable parameter shifts and premature failure of the circuit within the package.

The danger of circuit or device failure due to high sealing temperatures is even more acute when vitreous sealants are employed, since such sealants have fusing temperatures above 400° C. While vitreous sealants are much less expensive than the previously discussed gold-tin alloy, the higher fusing temperatures have precluded the use of such glass sealants in cases where component heating is a problem.

Methods such as impulse or impact welding using either fixed or rolling electrodes have been developed for sealing packages without unduly heating their contents; i.e. these techniques require metal covers and packages or, at the very least, metal sealing surfaces on both the cover and package. Unfortunately, the equipment needed to carry on such welding techniques is expensive, and special tooling is required for each package size. The metal packages themselves are also relatively expensive.

The term "hot-capping" refers to a method for sealing either metallic or ceramic lids and packages using a metallic sealant. If either the lid or package is ceramic, it must have a metallic sealing surface fused thereto. The seal is effected by applying an electrically heated surface to the cover. However, since the cover must be heated to at least the sealing temperature, the temperature of the electronic component or circuit will be raised.

Since ceramic packages are less expensive than metallic packages, and since vitreous sealing materials are less expensive than metal based sealants, the most economical approach to hermetically sealing packages would be to use ceramic packages and covers and seal them with a vitreous sealant without requiring fused metallization sealing layers.

In the above-identified co-pending application, an improved method and apparatus for hermetically sealing ceramic or metal packages housing electronic circuits is disclosed. Accordingly, a heater preform for sealing an electronic component package to a package cover is positioned between sealing surfaces on the the package and the cover. The heater preform has an area and shape corresponding to that of the sealing surfaces. In addition, the preform has first and second electrical contact areas. A vitreous sealing material is applied between the sealing surfaces and the preform. The heater preform is electrically heated to a predetermined temperature to effect a hermetic seal between the sealing surfaces of the package and the cover, the sealing material and the preform.

Whereas the process disclosed in the above identified copending application proves to a great improvement over known prior art, the need still exists to provide an even more efficient process for effecting a hermetic seal between ceramic packages and package covers at a lower temperature.

SUMMARY OF THE INVENTION

It is an object of the present invention to provide an improved cost efficient method and apparatus for sealing electronic circuits.

It is another object of the present invention to provide an improved method and apparatus for hermetically sealing a ceramic cover to a ceramic package using a vitreous sealant without excessively heating the electronic components or circuits therein.

It is another object of the invention to provide an improved method and apparatus for hermetically sealing a ceramic cover to a ceramic package without requiring metallic sealing layers on the ceramic.

It is another object of the invention to provide an improved method and apparatus for hermetically sealing a ceramic cover to a ceramic package, wherein the hermetic seal can be deliberately broken to facilitate repair of electronic components contained within the package.

It is another object of the invention to provide an improved method and apparatus for hermetically sealing a ceramic cover to a ceramic package without requiring a metallic preform to be positioned between sealing surfaces of the cover and package.

Accordingly, the above and other objects are achieved by a method for effecting a seal between a sealing area of a first body and a sealing area of a second body, comprising the steps of: bonding a heater layer of electrically conductive material to the sealing area of the first body; applying a sealing material between the sealing area of the second body and the heater layer bonded to the first body; aligning the sealing area of the second body with the sealing area of the first body; contacting the second body with the first body; and passing an electric current through the heater layer of electrically conductive material to thermally actuate the sealing material to cause the seal between the first body and the second body.

Addditionally an apparatus is disclosed for effecting a seal between a sealing area of a first body and a sealing area of a second body, wherein a heater layer of electrically conductive material is bonded to one of the sealing surfaces. The apparatus comprises: a stage for mounting and support the first body; a hold-down member for transporting, aligning and holding the second body; electronic means for passing an electric current through the heater layer of electrically conductive material; and means for controlling the temperature of the stage, the holddown member, and the electronic means.

The above and other objects, features and advantages of the invention will be better understood from the following detailed description taken in conjunction with the accompanying drawings, in which:

BRIEF DESCRIPTION OF THE DRAWING

FIG. 1 is an exploded view of a monolithic electronic component package having a heater pattern on a surface portion thereof for effecting a hermetic seal to the underside of the package cover.

FIG. 2 is a perspective view of the underside of the package cover of FIG. 1 having a sealing layer on a surface portion thereof corresponding to the heater layer on the monolithic package of FIG. 1.

FIG. 3 is a perspective view of a monolithic package configuration for effecting a hermetic seal to a package cover with a minimum of electronic component heating.

FIG. 4 is a magnified view of a portion of an exemplative heater pattern.

FIG. 5 is an exploded view of a lead frame electronic component package for effecting a heremetic seal to a top contact package lid in accordance with the present invention.

DESCRIPTION OF THE PREFERRED EMBODIMENTS

Figure 6:
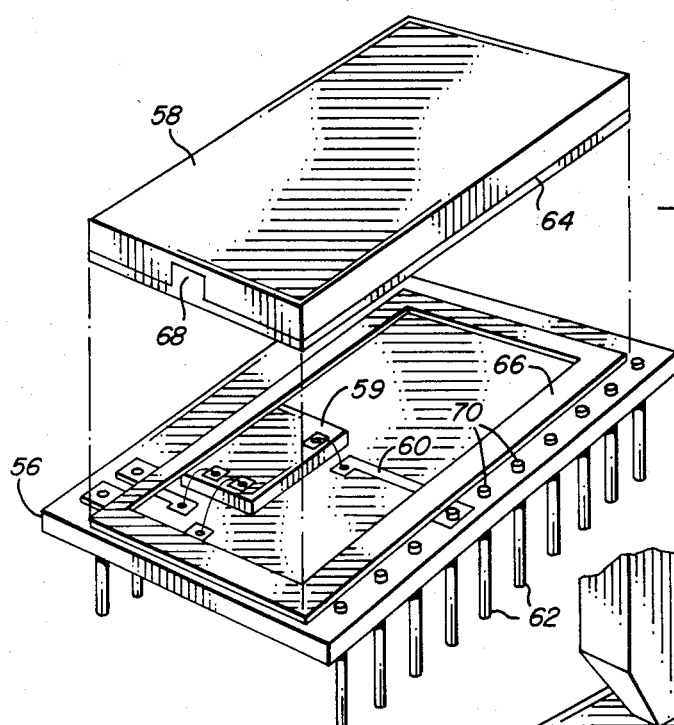
FIG. 6 is an exploded view of an omnipack electronic component package for effecting a heremetic seal to a side contact package cover in accordance with the present invention.

Referring to FIG. 1, an electronic component package is referenced generally by the numeral 10. The exploded view of FIG. 1 shows a monolithic package 12 and a package cover 14 for hermetically sealing a cavity base 16. Plural pins 18 are coupled to contacts 19 located in the cavity base 16. Electronic components may be mounted on the base 16 and coupled to the contacts 19. A heater layer 20 comprised of an electrically conductive material is bonded to the surface of the package 12 in the area of the seal between the package 12 and cover 14. The heater layer 20 is provided with plural contacts 22. Referring additionally to FIG. 2, the package cover 14 is covered with a sealing material 24 over a surface of the sealing area corresponding to the configuration of the heater layer 20 bonded onto the package 12.

The package 12 shown in FIG. 1 is ceramic made of a material having a low thermal conductivity, such as one of several formulations of ceramic. The heater layer 20 is comprised of a thick-film type powder, paste or liquid, which can be either painted or screened onto the sealing surface of the package 12 in accordance with known thick-film technology. The actual pattern of the heater layer 20 is discussed in detail below in reference to FIG. 4. The heater layer 20 is bonded to the sealing surface of the package 12 by means such as baking or the addition of a catalyst. The sealing material 24 can be organic, ceramic, glass or the like, and must be reactive to heat.

To effect the hermetic seal between the package 12 and the cover 14, the area of the cover 14 in which the layer of sealing material 24 is applied is aligned over the heater layer 20 of electrically conductive material bonded to the sealing surface of the package 12. The cover 14 is then pressed against the package 12 to contact the sealing material 24 with the heater layer 20. An electric current is then induced to flow through the heater layer 20 by any number of means. Most simply, electrodes may be applied to contacts 22 to directly introduce the charge flow in the heater layer 20. Alternately, if the heater layer 20 is comprised of material which can be dielectrically heated, then the current can be induced by an alternating electric field. Further, if the heater layer 20 is comprised of one or more closed loops, the current can be induced by magnetic induction. Regardless of the means utilized for inducing current flow in the heater layer 20, the sealing material 24 will be caused to cure, fuse, polymerise, or otherwise bond to the heater layer 20.

Referring to FIG. 3, an embodiment of the invention is shown which provides reduced thermal transfer of heat to the cavity base 16, and provides a faster sealing process between the heater layer 20 and the sealing material 24. To reduce the thermal flow of heat to the cavity base 16, and thereby reduce undesirable alterations in electronic component characteristics mounted therein, the package 12 is comprised of at least two different types of ceramic. A top portion 26 of the package 12 is comprised of a ceramic material having a relatively low degree of thermal conductivity, such as steatite. A bottom portion 28 of the package 12 is comprised of a ceramic material having a relatively higher degree of thermal conductivity, such as aluminum oxide. The top and bottom portions 26, 28 are cofired during manufacture with a suitable bonding agent.

The result of the particular construction of FIG. 3 is two fold. First, since the top portion 26 of the package 12 has a low degree of thermal conductivity, the heater layer 20 will be able to more efficiently actuate the sealing process, as heat will be directed towards the package cover 14. Secondly, heat generated by any electronic components mounted on the cavity base 16 is directed through the lower portion 28 because of the higher degree of thermal conductivity associated therewith.

In addition to providing multiple portions 26, 28 for the package 12, FIG. 3 also shows a protective layer 30 of nonconductive material apaplied over the cured heater layer 20. The protective layer 30 improves the contact between the sealing material 24 of the package cover 14 and the heater layer 20 of the package 12. As a result, heat is more efficiently transferred from the heater layer 20, through the protective layer 30 to the sealing material 24. Not only is the sealing process completed in less time, but the occurrence of burnout of the heater layer 20 is greatly reduced and less heat is conducted to the cavity base 16.

Shown in FIG. 4 is a magnified view of a heater pattern 20, with the shaded portions representing the conductive material. Areas 32 at the junction of the contact 22 and the heater layer 20 of the conductive paths are made narrower than all other areas except the corners 34. The narrower conductive paths at the junction area 32 of the contact area 22 result in a concentration of heat in that area. The heat concentration in the areas 32 is required to compensate for the tendency of the heat to flow from the heater layer 20 to the cooler electrode contact 22. Similarly, the narrower conductive paths located in the corners 34 result in a concentration of heat at the corners 34. The heat concentration in the corners 34 is required for compensation of the larger cross-sectional area of the corners 34, and to provide the heat necessary to fuse the larger quantity of sealing material 24 that covers the added cross-sectional area of the corners 34.

Thus, the heater pattern 20 shown in FIG. 4 concentrates heat in areas where, in the past, it would take a longer periof of time to complete the seal. As a result, the improved thick-film heater pattern 20 serves to more efficiently direct heat to locations having larger sealing volumes, thereby reducing the total time needed to effect the seal. It is noted that use of such heater layers having patterns functionally similar to that of FIG. 4 are not always necessary. However, utilization of heater layers 20 with such patterns serve to minimize the amount of conductive material necessary to form the heater layer 20, which may represent a significant economic savings depending on the size of the packages 12 or lids 14 and the type of conductive material employed. Also, such patterns increase the resistance of the heater layer 20 to achieve a higher heater voltage with a lower current. Further, when the bond between the heater layer 20 and the sealing material 24 is weaker than the bond between the sealing material 24 and the package 12 or cover 14, then utilization of the heater layer 20 having a pattern such as that of FIG. 4 will result in a stronger bond because of the plural voids 36 in the pattern. As a result, the sealing material 24 will not only bond to the heater layer 20, but also to the package 12 or cover 14 through the voids 36.

Shown in FIG. 5 is an exploded view of a lead frame electronic component package 12 and a top-contact package cover 14. The package 12 comprises three separate portions. Top portion 38 is made of a ceramic material which has a relatively low degree of thermal conductivity. Lower portion 40 is made of a ceramic material having a relatively high degree of thermal conductivity in comparison to the top portion 38. Middle portion 42 is a layer of sealing glass in which the multiple pins 18 are embedded. The package 12 of FIG. 5 functions thermally in a manner similar to that of FIG. 3. Since the top portion 38 is thermally non-conductive, heat from the sealing process is prevented from being conducted to the base cavity 16. In contrast, due to the relatively high degree of thermal conductivity in the bottom portion, heat generated by any circuits operating in the cavity 16 is conducted away from the package 12 through the pins 18 and bottom portion 42.

The package cover 14 is comprised of a ceramic material which can be either of the type having a high degree of thermal conductivity or of the type having a low degree of thermal conductivity. Bonded to the package cover 14 are plural top electrode contacts 44 and side heater layer contact 46. The contacts 44, 46 both comprise a material similar to that utilized in the heater layer 20, and are similarly bonded to the package cover 14. On the underside of the package cover 14, a heater layer 48 is bonded to a sealing area corresponding to sealing area 54 of the package 12. A layer of sealing material 50 is then applied over the heater layer 48. Optionally, a layer of sealing material can be applied to the sealing area 54 on the package 12.

To effect the seal, the package cover 14 is aligned over the sealing area 54 of the package 12. The cover 14 is then contacted to the package 12. The sealing material is actuated by contacting the electrode contacts 44, which are coupled to the heater layer 48 by the heater layer contacts 46.

Shown in FIG. 6 is an exploded view of an omni-pack package configuration, comprising the package 56 and the cover 58. It is readily apparent that the cover 58 is relatively larger than the covers 14 of FIGS. 1, 2 and 5. In addition, relatively larger hybrid circuits 59 and conductive paths 60 are mounted on the package 56. Plural pins 62 are coupled directly to the conductive paths 60 by pin heads 70.

Since the package cover 58 is so large, as required by the large circuits 59, it becomes very difficult to place contacts on the surface of the package 56. As a result, contacts 68 for the heater layer 64 are made on the side of the package cover 58. The heater layer 64 is bonded to the bottom of the package cover 58 in a manner similar to that described in reference to FIG. 5. Similarly, a layer of sealing material 66 can be applied over a sealing area of the package 56, or, optionally over the heater layer 64. The seal between the package 56 and the cover 58 is effected by causing a current to be induced to flow in the heater layer 64, resulting in the sealing layer being bonded to both the heater layer 64 and the package 56.

It is important to note that because contact to the heater layer 64 is made on the package cover 58 by side heater layer contacts 68, the package cover can be made to cover the heads 70 of the pins 62. This particular embodiment is shown in FIG. 9 and requires only minor alterations to the embodiment shown in FIG. 6.

Figure 7:
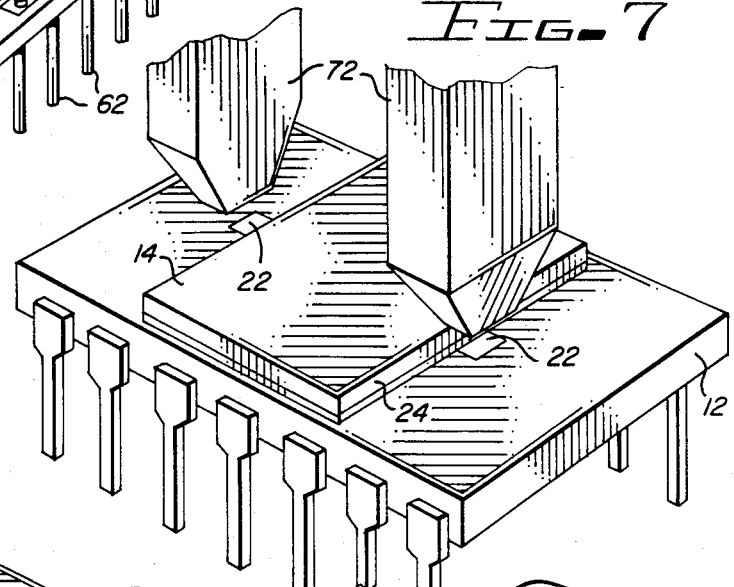
FIG. 7 is a perspective view of electrodes for contacting the heater pattern utilized with the monolithic package of FIG. 1.
Figure 8:
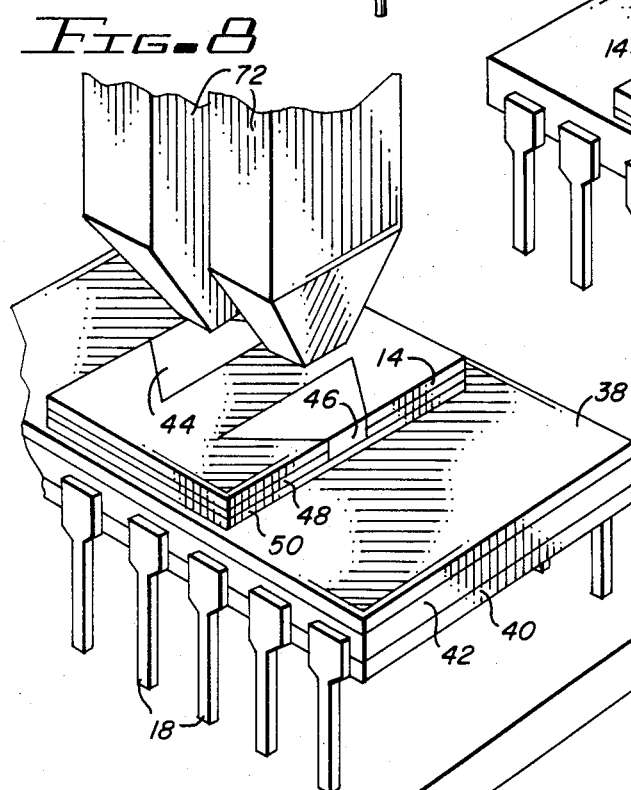
FIG. 8 is a perspective view of electrodes for contacting the heater pattern utilized with the lead frame package of FIG. 5.
Figure 9:
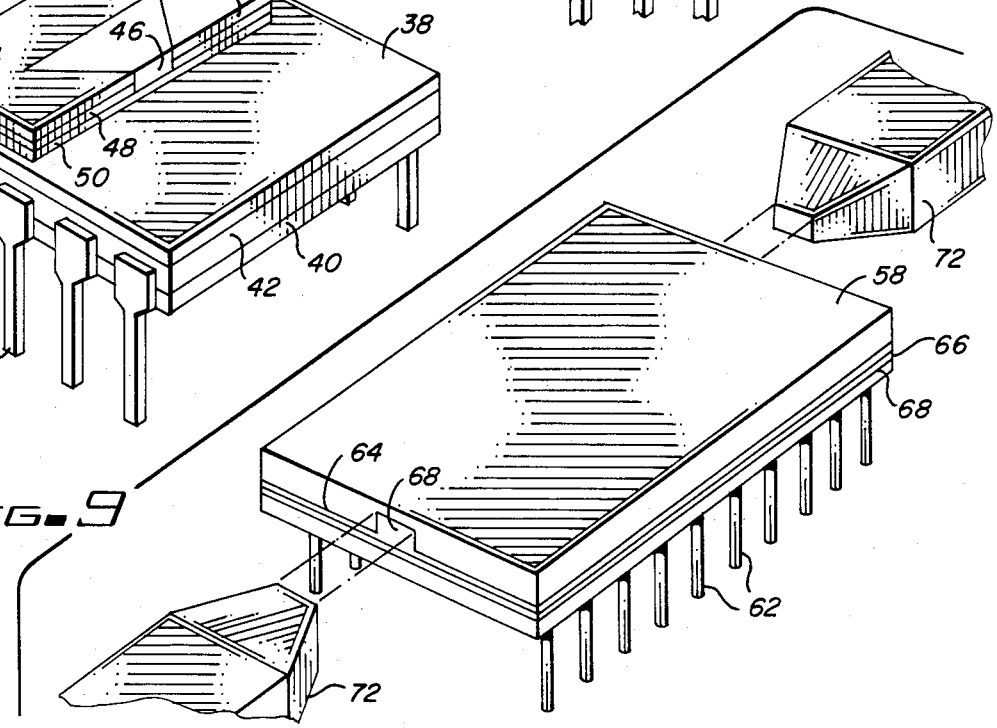
FIG. 9 is a perspective view of electrodes for contacting the heater pattern utilized with a modified version of the standard omnipack of FIG. 6.

FIGS. 7, 8 and 9 show a pair of electrodes 72 making contact to the package and package cover combinations referenced above in FIGS. 1, 5 and 6. In FIG. 7, the electrodes 72 make contact to the heater layer 20 at the heater layer contacts 22 bonded to the surface of the monolithic package 12. In FIG. 8, the electrodes 72 make contact to the heater layer 48 by contacting the electrode contacts 44 bonded to the top of the package cover 14, which are in turn coupled to the heater layer 48 by heater-layer contacts 46 bonded to the side of the package cover 14. Shown in FIG. 9 is the modified omnipack embodiment discussed in reference to FIG. 6. Grooves (not shown) are located along the underside of the package cover 58 to accommodate the heads 70 of the plural pins 62. In addition, electrodes 72 contact the heater layer contacts 68 on the side of the package cover 58.

Figure 10:
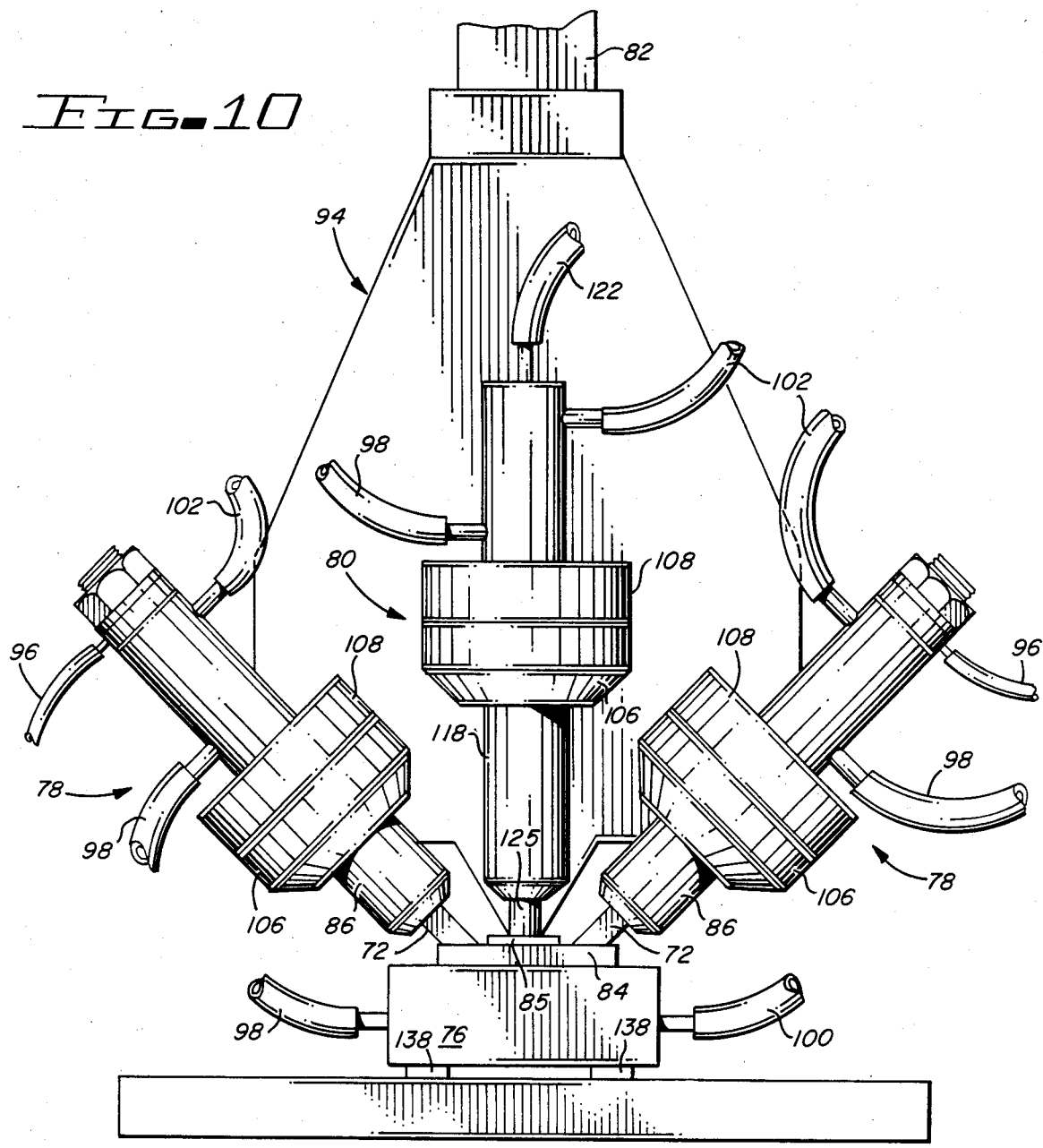
FIG. 10 is a front view of an apparatus for holding and contacting a heater pattern of an electronic component package to effect a heremetic seal between an electronic component package and corresponding cover in accordance with the present invention.

Shown in FIG. 10 is an apparatus for effecting a seal between a package and a package cover. The apparatus is referenced generally by the numeral 74, and is adapted specifically for top contact package and package cover combinations as shown in FIGS. 7 and 8. The apparatus 74 comprises a stage 76 for mounting and supporting a package 84, plural electrode assemblies 78, and a hold-down assembly 80. The apparatus 74 is coupled by a shaft 82 to a mechanical, electromechanical, hydraulic or pneumatic actuating means for raising and lowering the electrode assemblies 78 and the holddown assembly 80 simultaneously to contact the package 84.

Figure 11:
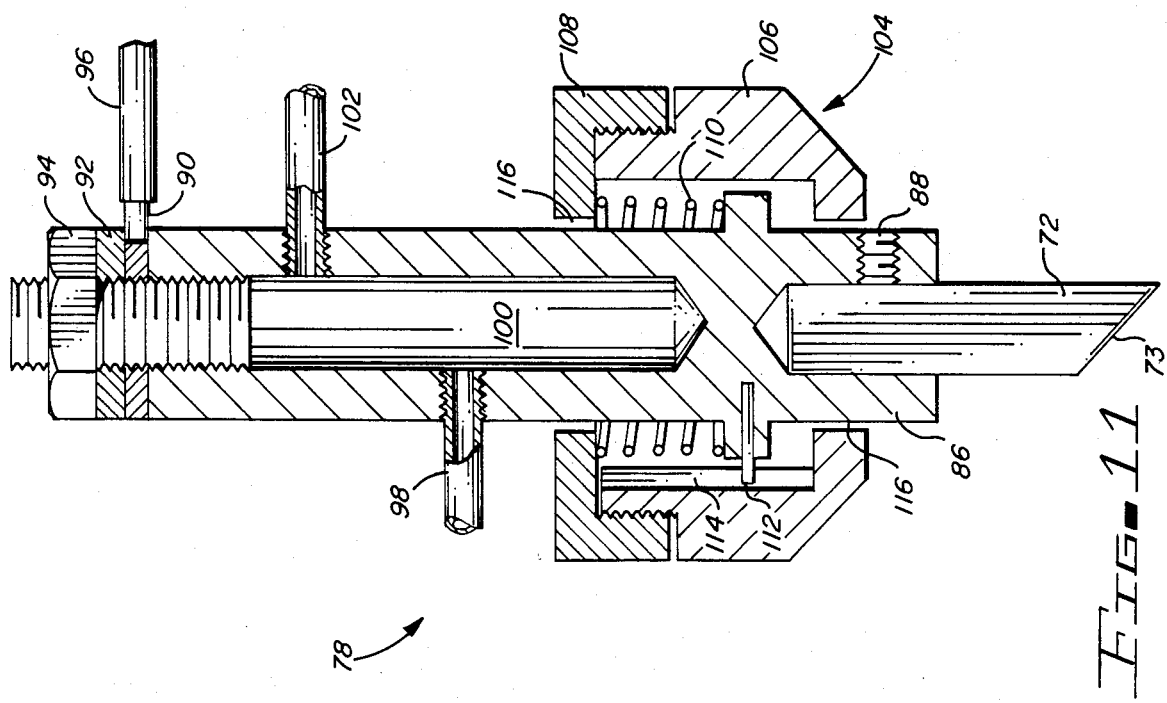
FIG. 11 is a sectional view of an electrode assembly for use with the apparatus of FIG. 10.

Referring additionally to FIG. 11, the electrode 72 is fitted into an electrode mount 86 and retained in place by a set screw 88. The opposite end of the electrode mount 86 is threaded to accommodate a lug 90, washer 92, and nut 94. An electric wire 96 is attached to the lug 90. Liquid or gas is introduced through an inlet 98, passes through a cooling chamber 100, and exited through an outlet 102 to control the temperature of the electrode 72 and electrode mount 86. The electrode mount 86 rides in a spring loaded cell 104 comprising a body 106, a cap 108 and spring 110 retained therein. A pin 112 rides in a track 114 to prevent rotation of the electrode mount. Contact regions between the body 106 and cap 108 and the electrode mount 86 are intentionally left with spaces 116 so that the electrode mount 86 can tilt slightly to permit the plane of the electrode contact face 73 to align itself with the plane of the heater contacts 22. The spring loaded cell 104 serves to compensate for misalignments, apply even pressure to the heater contacts 22, and allow for thermal expansion. The top-contact electrode configuration shown in FIG. 5 is useful for the sealing of Corpacs, or chip carriers, where space for electrode contact areas is not available on the package 12.

Figure 12:
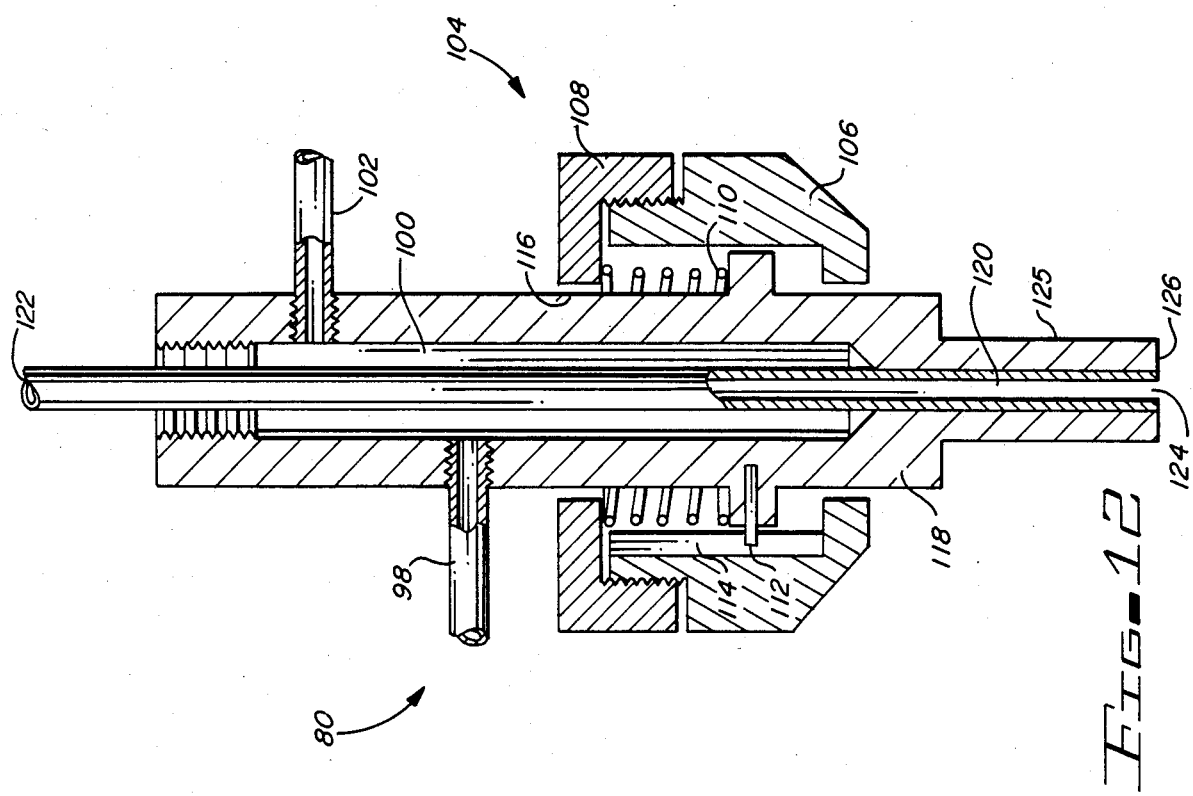
FIG. 12 is a sectional view of a hold down assembly for use with the apparatus of FIG. 10.

Referring additionally to FIG. 12, the hold-down assembly comprises a hold down body 118 mounted in a spring loaded cell 104 similar to that described above in reference to FIG. 11. The hold-down body 118 comprises a vacuum tube 120 coupled to vacuum inlet 122 and a vacuum outlet 124. Hold-down faces 126 serve to hold the package cover 14. Means for controlling the temperature of the hold-down body 118 comprises gas or liquid inlet 98, cooling chamber 100 and outlet 102, which function similarly to the cooling means described above in reference to FIG. 11.

Figure 13A:
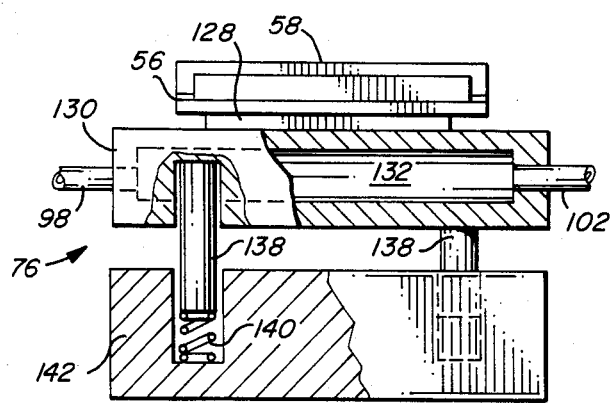
FIG. 13a and 13b are front and side sectional views of a spring loaded stage assembly for use with the apparatus of FIG. 10.
Figure 13B:
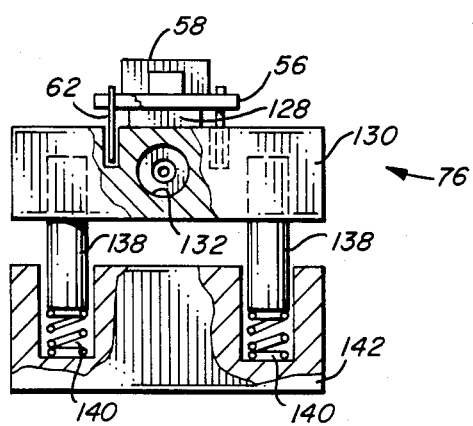

The stage 76 is also disclosed in FIGS. 13a and 13b. For illustrative purposes the stage 76 is shown supporting a sidecontact package such as that reference in FIG. 6, in contrast to the top-contact package shown in FIG. 10. The package cover 58 is placed on the package 56 by the hold-down assembly 80 (not shown in FIGS. 13a or 13b). The package 56 is mounted on a stage plate 128 which in turn is mounted on the stage base 130. Within the stage base 130 is a cooling chamber 132, through which is passed a gas or liquid through inlet 98 and outlet 102. Notice that the stage plate 128 elevates the package 56 to cause the package 56 to overhang the stage plate 130 and to provide a proper thermal gradient to facilitate the bonding process. Spring loading of the stage base 130 is achieved by mounting stage alignment pins 138 within the stage base 130. The alignment pins 138 press against plural springs 140 corresponding thereto. The springs 140 are retained in a spring base 142.

Referring again to FIG. 10, to effect a seal between a top contact package 84 and a package cover 85, a package 84 is transported to and mounted on the stage 130. A cover 85 is placed at the end of the hold-down assembly 80, and is transported and aligned over the package 84. The electrode assemblies 78 and the hold-down assembly 80 are lowered until the electrodes 72 contact the heater layer contacts 22, and the package cover 85 contacts the package 84. The springs in cells 104 and the base 142 provide the constant force required to keep the cover 85 in contact with the package 84, while simultaneously compensating for thermal expansion.

By reheating the sealed package 84 and cover 85, the seal can be broken to allow for repair or replacement of the electronic components contained within the package. A new cover can be used and new layers of sealing material applied to repeat the sealing procedure.

The above description is given by way of example only. Changes in form and details may be made by one skilled in the art without departing from the scope of the invention as defined by the appended claims.

For example, as shown by FIGS. 10, 13a and 13b the stage 76 shown in FIG. 10 may or may not, as desired, include the springs 140 shown in the stages of FIGS. 13a and 13b. The springs 140 shown in FIGS. 13a and 13b are flexible and thus facilitate the bonding action (i.e. such as for the side-contact electrodes as shown in FIG. 9). In such a configuration, the hold-down assembly 80 of FIG. 10 presses down on the cover 58 (see FIGS. 13a and 13b), which in turn presses down on the package 56. As a result, the spring loaded stage 76 of FIGS. 13a and 13b is depressed and exerts an upward force opposing that of the hold-down assembly 80. The electrodes 72 (shown in FIG. 10) exert pressure laterally on the cover 58 (shown in FIGS. 13a and 13b) from both sides, clamping the cover 58 firmly in place. As current is applied to the heater, the sealing glass softens and the spring loaded stage 76 will push the package 56 up against the cover 58.

What is claimed is:

1. An apparatus for effecting a seal between a sealing area of an electronic component package and a sealing area of a package cover, wherein a conductive heater layer is bonded to one of the sealing areas, comprising:
   (a) stage means for mounting and supporting the package, said stage means being further mounted on a support base and having spring means disposed therebetween for providing a constant force on said stage means thereby maintaining a constant contact force between the electronic component package and the package cover;
   (b) means for holding, transporting and aligning the package cover including (i) a mount, (ii) holddown means retained within the mount for transporting the cover to the package, aligning the sealing area of the cover with the sealing area of the package, and holding the cover with the sealing area of the package, and holding the cover in contact with the package during a sealing operation and (iii) means for controlling the temperature of the hold-down means;

(c) electrode means for electrically contacting the conductive heater layer, said electrode means comprising: (i) a mount, (ii) an electrode retained with the mount and having a contact face for contacting the conductive heater layer; (iii) means for absorbing impact of the electrode with the conductive heater layer; (iv) means for aligning a plane of the electrode contact face with the conductive heater layer; and (v) means for controlling the temperatures of the electrode; and (d) means for inducing an electric current to pass through the electrodes to the conductive heater layer.

* * * * *